(12) United States Patent
Kawai et al.

(10) Patent No.: US 12,041,729 B2
(45) Date of Patent: Jul. 16, 2024

(54) PRINTED WIRING BOARD

(71) Applicant: IBIDEN CO., LTD., Gifu (JP)

(72) Inventors: Satoru Kawai, Ogaki (JP); Yasuki Kimishima, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 742 days.

(21) Appl. No.: 17/158,500

(22) Filed: Jan. 26, 2021

(65) Prior Publication Data

US 2021/0251087 A1    Aug. 12, 2021

(30) Foreign Application Priority Data

Feb. 6, 2020 (JP) .................................. 2020-018691

(51) Int. Cl.
  *H05K 1/11* (2006.01)
  *H05K 3/42* (2006.01)
  *H05K 3/46* (2006.01)

(52) U.S. Cl.
  CPC ............. *H05K 3/429* (2013.01); *H05K 1/115* (2013.01); *H05K 3/4605* (2013.01); *H05K 2201/09563* (2013.01); *H05K 2201/0959* (2013.01)

(58) Field of Classification Search
  CPC ........ H05K 1/112; H05K 1/113; H05K 1/115; H05K 1/116; H05K 1/165; H05K 2201/09563; H05K 2201/09536; H05K 2201/09545; H05K 2201/09654; H05K 2201/0979; H05K 2201/09818; H05K 2201/09881; H05K 2201/09909; H05K 2201/09972; H05K 2201/0959; H05K 2201/086; H01F 2017/002; H01F 1/061
  See application file for complete search history.

(56) References Cited

U.S. PATENT DOCUMENTS

| 5,763,085 | A | * | 6/1998 | Atarashi | ................. | H01F 41/16 |
| | | | | | | 428/570 |
| 2007/0257761 | A1 | * | 11/2007 | Mano | ...................... | H01F 17/06 |
| | | | | | | 336/200 |
| 2019/0279806 | A1 | * | 9/2019 | Darmawikarta | .... | H01F 27/2804 |

FOREIGN PATENT DOCUMENTS

JP  2019-129278 A  8/2019

* cited by examiner

*Primary Examiner* — Roshn K Varghese
(74) *Attorney, Agent, or Firm* — Oblon, McClelland, Maier & Neustadt, L.L.P.

(57) ABSTRACT

A printed wiring board includes an insulating substrate, a first conductor layer formed on a first surface of the substrate, a second conductor layer formed on a second surface of the substrate, and through-hole conductors formed through the substrate and connecting the first and second conductor layers. The substrate has openings formed such that each opening extends from the first to second surfaces of the substrate, and magnetic material filling the openings and forming through holes such that each through hole extends from the first to second surfaces of the substrate, the through-hole conductors are formed on sidewalls of the through holes in the magnetic material, and the magnetic material includes resin and particles including magnetic metal such that the particles include a group of particles forming the sidewalls of the through holes and that each particle in the group has a substitution plating film formed on a surface thereof.

20 Claims, 5 Drawing Sheets

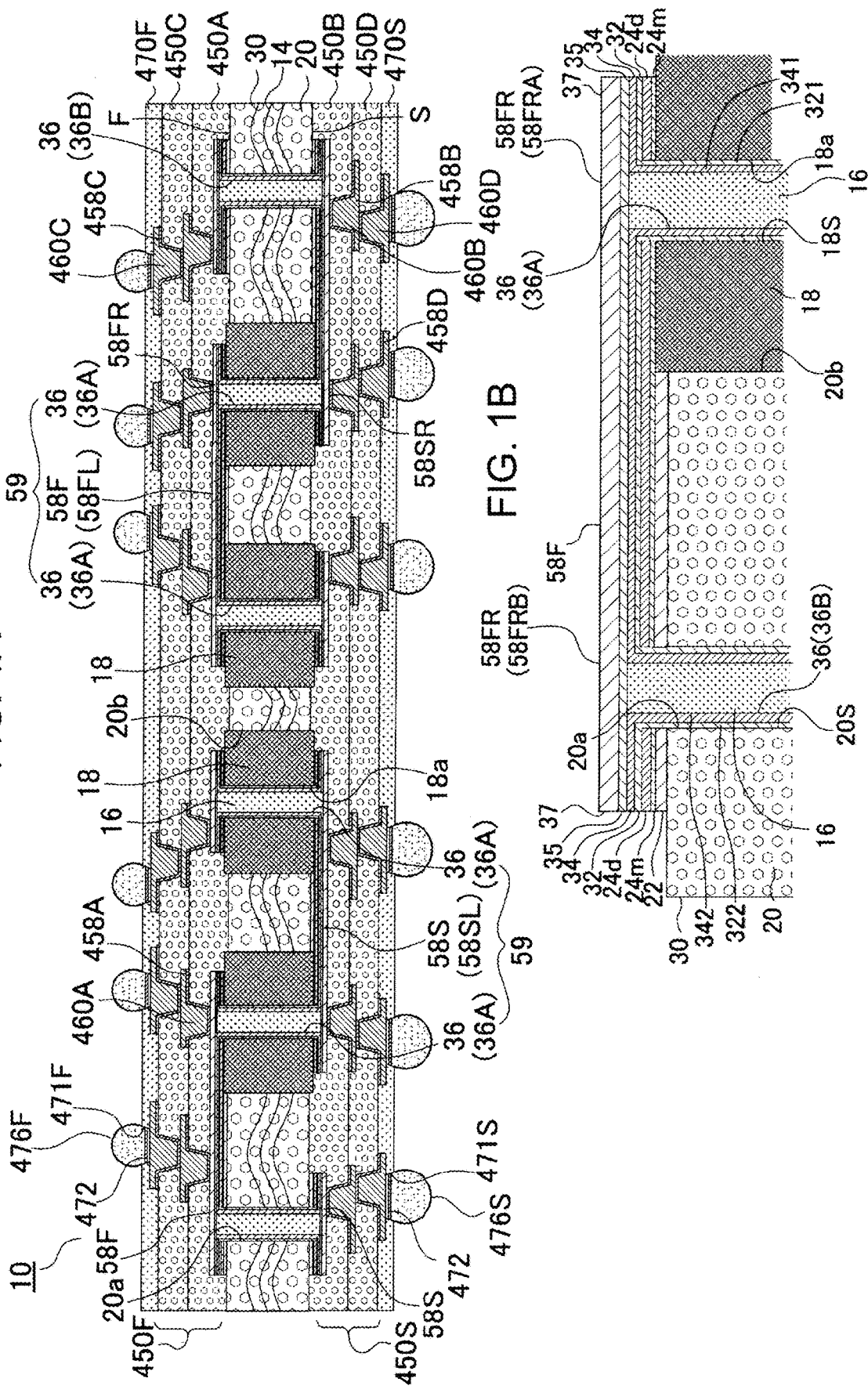

PRINTED WIRING BOARD

CROSS-REFERENCE TO RELATED APPLICATIONS

The present application is based upon and claims the benefit of priority to Japanese Patent Application No. 2020-018691, filed Feb. 6, 2020, the entire contents of which are incorporated herein by reference.

BACKGROUND OF THE INVENTION

Field of the Invention

The present invention relates to a printed wiring board having through-hole conductors penetrating magnetic material.

Description of Background Art

Japanese Patent Application Laid-Open Publication No. 2019-129278 describes a printed wiring board which includes a core substrate having an opening, an inductor component accommodated in the opening, and a build-up layer formed on the core substrate. A filling resin is filled between a sidewall of the opening and a sidewall of the inductor component. The inductor component has a magnetic base material and a through-hole conductor that penetrates the magnetic base material. The entire contents of this publication are incorporated herein by reference.

SUMMARY OF THE INVENTION

According to one aspect of the present invention, a printed wiring board includes an insulating substrate, a first conductor layer formed on a first surface of the insulating substrate, a second conductor layer formed on a second surface of the insulating substrate on the opposite side with respect to the first surface, and through-hole conductors formed through the insulating substrate and connecting the first conductor layer and the second conductor layer. The insulating substrate has openings formed such that each of the openings extends from the first surface to the second surface of the insulating substrate, and magnetic material filling the openings and forming through holes such that each of the through holes extends from the first surface to the second surface of the insulating substrate, the through-hole conductors are formed on sidewalls of the through holes formed in the magnetic material, respectively, and the magnetic material includes resin material and particles including a magnetic metal such that the particles include a group of particles forming the sidewalls of the through holes and that each of the particles in the group has a substitution plating film formed on a surface thereof.

According to another aspect of the present invention, a method for manufacturing a printed wiring board includes forming a first conductor layer on a first surface of an insulating substrate, forming a second conductor layer on a second surface of the insulating substrate on the opposite side with respect to the first surface, and forming through-hole conductors through the insulating substrate such that the through-hole conductors connect the first conductor layer and the second conductor layer. The forming of the insulating substrate includes forming openings such that each of the openings extends from the first surface to the second surface of the insulating substrate, filling magnetic material in the openings, forming through holes in the magnetic material in the openings such that each of the through holes extends from the first surface to the second surface of the insulating substrate, and forming the through-hole conductors on sidewalls of the through holes formed in the magnetic material, respectively, and the magnetic material includes resin material and particles including a magnetic metal such that the particles includes a group of particles forming the sidewalls of the through holes and that each of the particles in the group has a substitution plating film formed on a surface thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of a printed wiring board according to an embodiment of the present invention;

FIG. 1B is an enlarged view of a core substrate of the printed wiring board;

DETAILED DESCRIPTION OF THE EMBODIMENTS

Figure 2A:
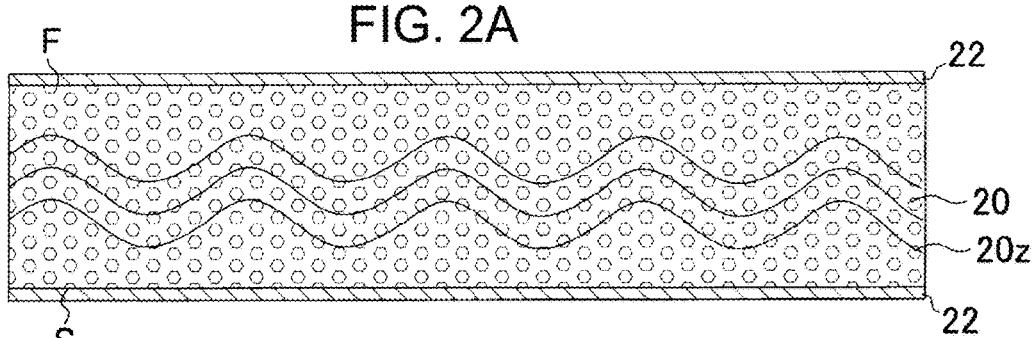
FIGS. 2A-2E are process diagrams illustrating a method for manufacturing a printed wiring board according to an embodiment of the present invention.

Embodiments will now be described with reference to the accompanying drawings, wherein like reference numerals designate corresponding or identical elements throughout the various drawings.

FIG. 1A illustrates a cross section of a printed wiring board 10 of an embodiment. The printed wiring board 10 has a core substrate 30 which is formed to include: an insulating substrate 20 having a first surface (F) and a second surface (S) on an opposite side with respect to the first surface (F); a first conductor layer (58F) on the first surface (F) of the insulating substrate 20; a second conductor layer (58S) on the second surface (S) of the insulating substrate 20; and through-hole conductors 36 connecting the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating substrate 20 are the same surface, and the second surface (S) of the core substrate 30 and the second surface (S) of the insulating substrate 20 are the same surface. The insulating substrate 20 is formed of a resin such as an epoxy resin and reinforcing material such as a glass cloth. The insulating substrate 20 may further contain inorganic particles such as silica particles.

The printed wiring board 10 further has an upper side build-up layer (450F) on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A); a conductor layer (458C) formed on the insulating layer (450C); and via conductors (460C) penetrating the insulating layer (450C) and connecting the conductor layer (458A) and the conductor layer (458C) to each other.

The printed wiring board 10 further has a lower side build-up layer (450S) on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the conductor layer (458D) to each other.

The printed wiring board 10 of the embodiment further includes a solder resist layer (470F) formed on the upper side build-up layer (450F) and a solder resist layer (470S) formed on the lower side build-up layer (450S). The solder resist layer (470F) has openings (471F). The solder resist layer (470S) has openings (471S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, OSP, or the like is formed on each of the pads. Solder bumps (476F, 476S) are respectively formed on the protective films. An IC chip is mounted on the printed wiring board 10 via the solder bumps (476F) that are formed on the upper side build-up layer (450F). The IC chip is not illustrated in the drawings. The printed wiring board 10 is mounted on a motherboard via the solder bumps (476S) that are formed on the lower side build-up layer (450S).

FIG. 1B illustrates a portion of the core substrate 30 in FIG. 1A. As illustrated in FIGS. 1A and 1B, the core substrate 30 further has openings (20b) and second through holes (20a) that penetrate the insulating substrate 20. Magnetic material 18 having first through holes (18a) are formed in the openings (20b). The openings (20b), the first through holes (18a), and the second through holes (20a) each extend from the first surface (F) to the second surface (S). The first through holes (18a) penetrate through the magnetic material 18.

Figure 5A:
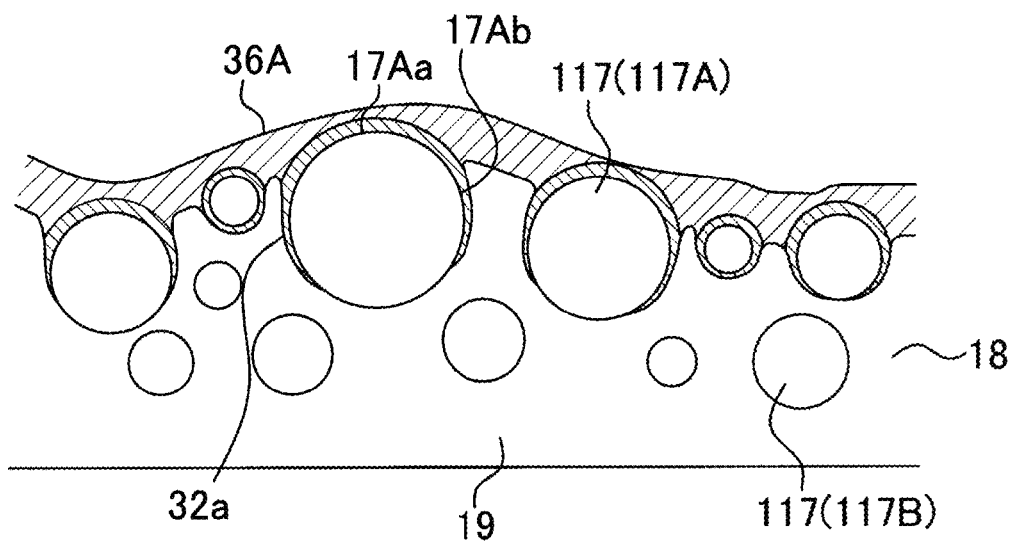
FIG. 5A is a schematic diagram illustrating the substitution plating film.
Figure 5B:
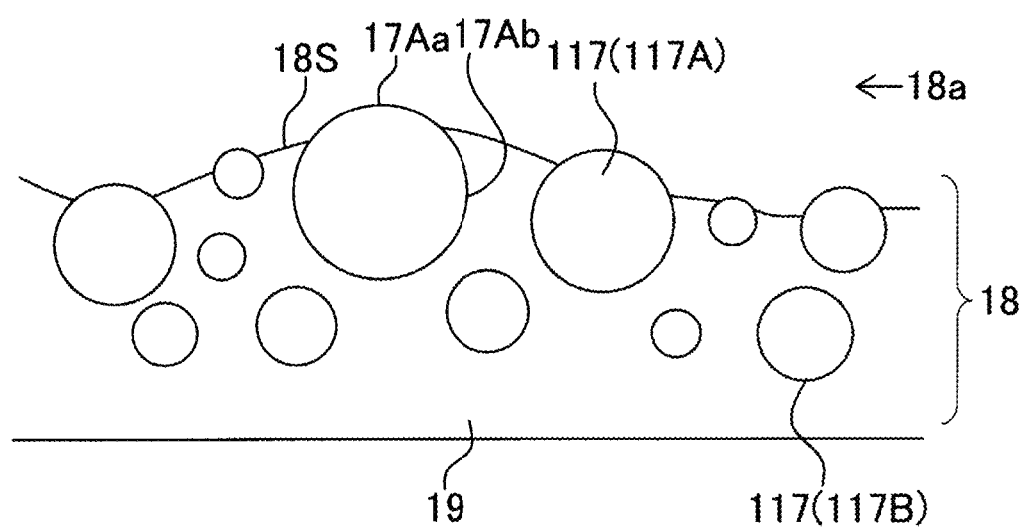
FIG. 5B is a schematic diagram illustrating magnetic material.

As illustrated in FIG. 5B, the magnetic material 18 contains particles (magnetic particles) 117 formed of a magnetic metal, and a resin 19. Examples of the magnetic particles 117 include iron particles, nickel particles, and cobalt particles. Iron particles are preferred. A content of the magnetic particles in the magnetic material 18 is preferably 60% by weight or more. Magnetic permeability and thermal conductivity can be increased. Examples of the resin forming the magnetic material 18 include epoxy and polyimide.

FIG. 5B illustrates a portion of the magnetic material 18. FIG. 5B illustrates a sidewall (18S) of the magnetic material 18 exposed by one of the first through holes (18a), the magnetic material 18, and the one of the first through holes (18a). The sidewall (18S) is also a sidewall of the one of the first through holes (18a). Circles in FIG. 5B schematically illustrate the magnetic particles 117. The magnetic particles 117 include particles (first particles) (117A) exposed by the first through holes (18a) and particles (second particles) (117B) completely embedded in the resin 19. Surfaces of the first particles (117A) exposed by the first through holes (18a) are a portion of the sidewall (18S). The first particles (117A) form the sidewall (18S). The surfaces of the first particles (117A) are each formed by a surface (exposed surface) (17Aa) forming the sidewall (18S) and a surface (inner surface) (17Ab) other than the exposed surface (17Aa). The magnetic particles 117 preferably do not have uniform particle sizes. The number of the first particles (117A) can be increased.

The through-hole conductors 36 include first through-hole conductors (36A) formed in the first through holes (18a) and second through-hole conductors (36B) formed in the second through holes (20a). When the through-hole conductors (36A, 36B) each have a tubular shape, a resin 16 is filled in the through-hole conductors.

The first conductor layer (58F) and the second conductor layer (58S) have through-hole lands (58FR, 58SR) formed around the through-hole conductors 36. The through-hole lands (58FR, 58SR) are directly connected to the through-hole conductors 36. The through-hole lands (58FR, 58SR) can cover the resin 16.

As illustrated in FIG. 1B, the second through-hole conductors (36B) are in contact with the insulating substrate 20 exposed by the second through holes (20a). The second through-hole conductors (36B) are formed by a second chemical plating film 322 on sidewall (20S) of the second through holes (20a) and a second electrolytic plating film 342 on the second chemical plating film 322. The second chemical plating film 322 and the second electrolytic plating film 342 are each formed of a copper plating film.

The first through-hole conductors (36A) are in contact with the sidewalls (18S) of the first through holes (18a). The first through-hole conductors (36A) are formed by a first chemical plating film 321 on the sidewalls (18S) of the first through holes (18a) and a first electrolytic plating film 341 of the first chemical plating film 321. The first chemical plating film 321 and the first electrolytic plating film 341 are each formed of a copper plating film.

Figure 4:
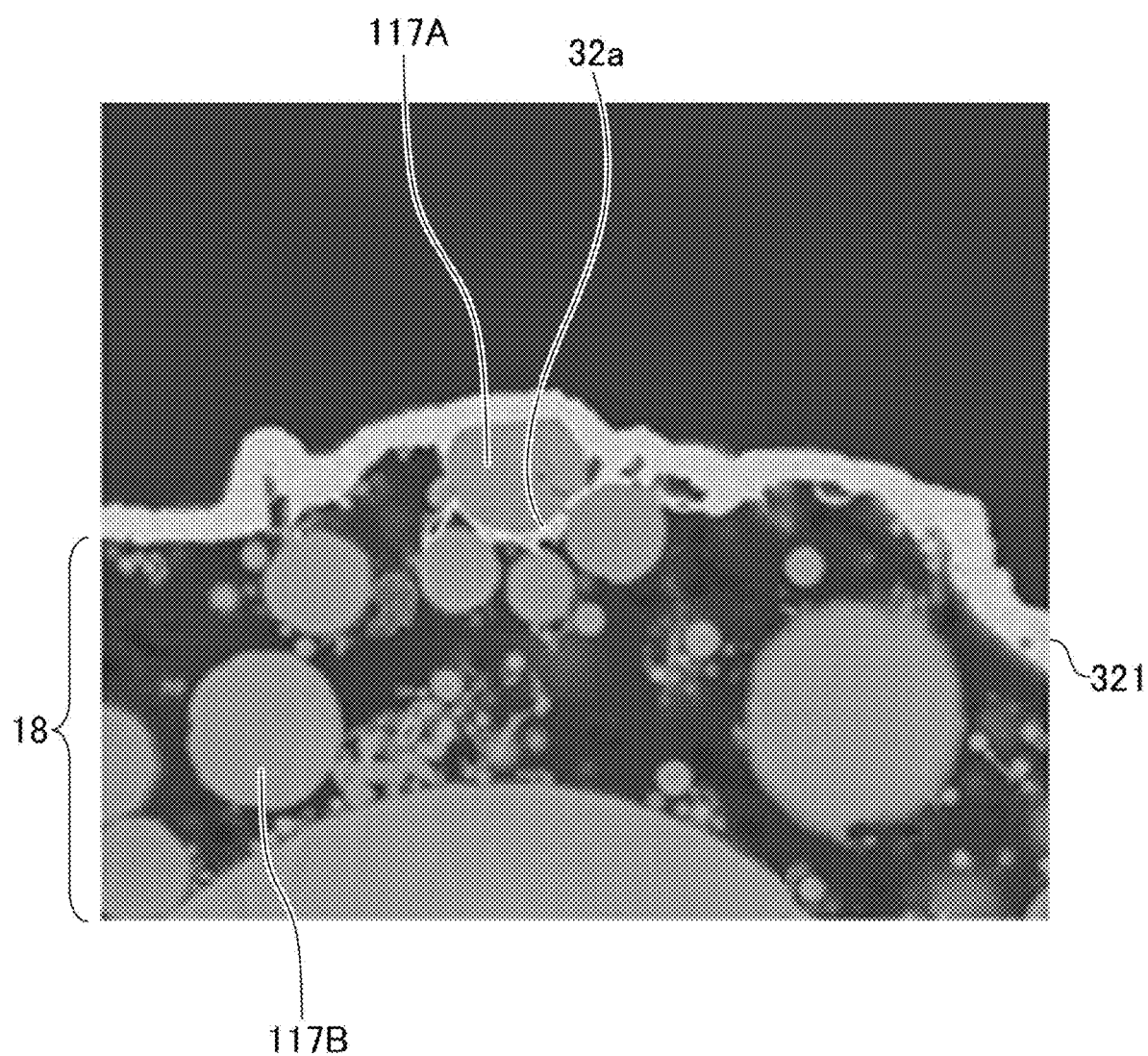
FIG. 4 is a photomicrograph showing a substitution plating film.

FIG. 4 is a photomicrograph. FIG. 4 illustrates the magnetic material 18, the first chemical plating film 321, and a substitution plating film (32a). FIG. 5A schematically illustrates one of the first through-hole conductors (36A), the substitution plating film (32a), and the magnetic material 18. As illustrated in FIGS. 4 and 5A, the substitution plating film (32a) is formed on the surfaces of the first particles (117A). The substitution plating film (32a) is formed by a substitution reaction between a metal forming the magnetic particles 117 and a metal forming the first chemical plating film 321. The substitution plating film (32a) is formed on the exposed surfaces (17Aa). Or, the substitution plating film (32a) is formed on the inner surfaces (17Ab). Or, the substitution plating film (32a) is formed on the exposed surfaces (17Aa) and the inner surfaces (17Ab). The substitution plating film (32a) is not formed on the surfaces of the second particles (117B) that are completely covered by the resin 19 forming the magnetic material 18. However, when the second particles (117B) are in contact with the first particles (117A), the substitution plating film (32a) is formed on the second particles (117B) that are in contact with the first particles (117A).

When the substitution plating film (32a) is formed on the surfaces of the first particles (117A), the first particles (117A) are connected to the first chemical plating film 321 via the substitution plating film (32a). An adhesive force between the first through-hole conductors (36A) and the first particles (117A) can be increased. The first through-hole conductors (36A) can be prevented from peeling off from the magnetic material 18.

When the substitution plating film (32a) is formed on the inner surfaces (17Ab), the substitution plating film (32a) enters into the magnetic material 18. The substitution plating film (32a) extending from the first chemical plating film 321 reaches inside of the magnetic material 18. An adhesive force between the first through-hole conductors (36A) and the magnetic material 18 can be increased. Even when the printed wiring board 10 is subjected to heat cycles, the first through-hole conductors (36A) are unlikely to peel off from the magnetic material 18.

In the embodiment, processes are managed such that the substitution plating film (32a) is formed on the first particles (117A). For example, a process in which the first through holes (18a) are formed is managed. A process in which the first through holes (18a) are washed is managed. A process in which the first chemical plating film 321 is formed is managed. Time between processes is managed. Examples of items to be managed include temperature of washing water and dissolved oxygen in the washing water. Humidity and atmosphere can be managed. The first through holes (18a) may be washed with an acid before the first chemical plating film 321 is formed. Therefore, even when an oxide film is formed on the first particles (117A), according to the embodiment, a substitution reaction occurs. The oxide film is not so thick that no substitution reaction occurs.

The magnetic material 18 is in contact with sidewalls of the insulating substrate 20 exposed by the openings (20b). The number of the first through holes (18a) positioned in each one of the openings (20b) is 1. The number of the first through holes (18a) formed in each one of the magnetic material 18 is 1. Therefore, a diameter of each of the openings (20b) can be reduced. A volume of each one of the magnetic material 18 in the openings (20b) can be reduced. A thermal expansion coefficient of the insulating substrate 20 and a thermal expansion coefficient of the magnetic material 18 are different from each other. Even when the magnetic material 18 is in contact with the insulating substrate 20, a stress caused by the difference in thermal expansion coefficient between the two can be reduced. Adhesion between the magnetic material 18 and the first through-hole conductors (36A) via the substitution plating film (32a) is stable over a long time. The first through-hole conductors (36A) are unlikely to peel off from the magnetic material 18. A diameter of each of the first through holes (18a) can be reduced. A spacing between adjacent first through-hole conductors 36 can be reduced.

The first conductor layer (58F) can include first connection wirings (58FL) that each connect two of the first through-hole conductors (36A) to each other. The second conductor layer (58S) can include second connection wirings (58SL) that each connect two of the first through-hole conductors (36A) to each other. The multiple first through-hole conductors (36A) are connected in series via the first connection wirings (58FL) and the second connection wirings (58SL). An inductor 59 is formed by the multiple first through-hole conductors (36A), the multiple first connection wirings (58FL) and the multiple second connection wirings (58SL). In the inductor 59, the first through-hole conductors (36A), the first connection wirings (58FL) and the second connection wirings (58SL) are formed in the order of the first connection wirings (58FL), the first through-hole conductors (36A), and the second connection wirings (58SL). The wirings forming the inductor 59 extend in a direction parallel to the first surface (F).

Method for Manufacturing Printed Wiring Board

Figure 2B:
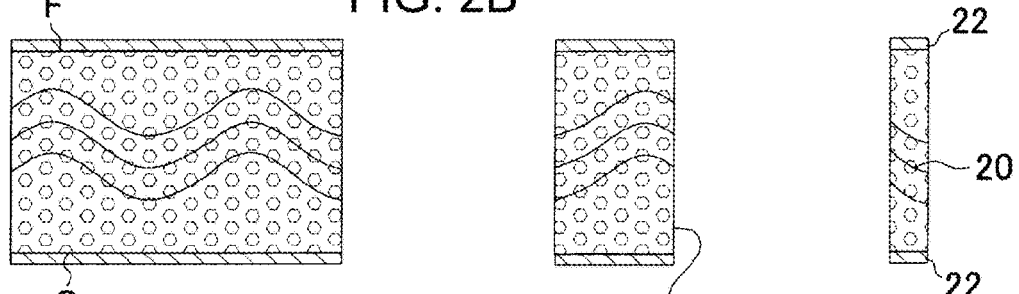
Figure 2C:
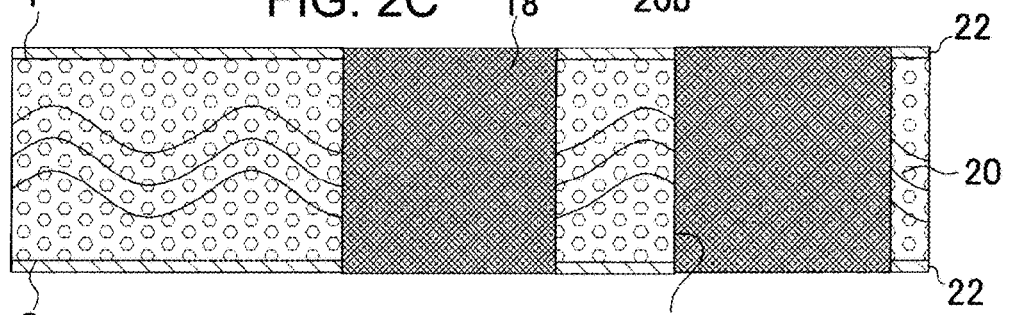

FIGS. 2A-2E and 3A-3D illustrate a method for manufacturing a printed wiring board 10 according to an embodiment of the present invention. A copper-clad laminated plate (20z) is prepared (FIG. 2A). The copper-clad laminated plate (20z) is formed of the insulating substrate 20 and a copper foil 22 laminated on both sides of the insulating substrate 20. The openings (20b) are formed in the insulating substrate 20 (FIG. 2B). The magnetic material 18 is filled in the openings (20b) respectively by printing. The magnetic material 18 is formed of iron particles (magnetic particles) and an epoxy resin. An amount of the iron particles in the magnetic material 18 is 90 wt %.

Figure 2D:
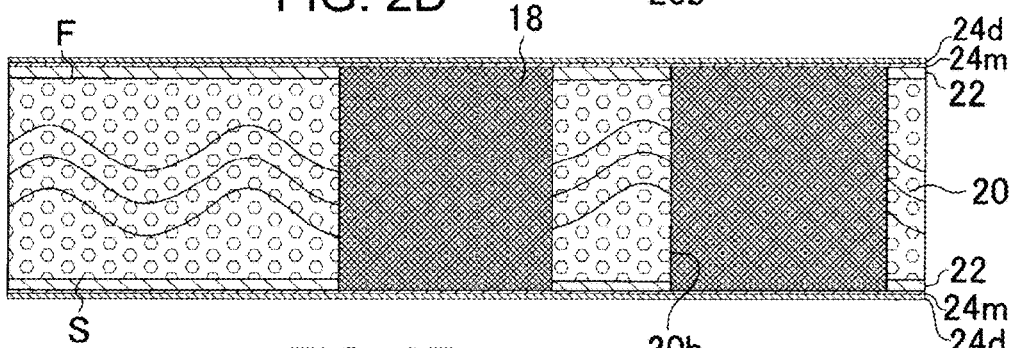

A chemical plating film (24m) and an electrolytic plating film (24d) are formed on the copper foil 22 and the magnetic material 18 (FIG. 2D). The chemical plating film (24m) and the electrolytic plating film (24d) on the chemical plating film (24m) are formed of copper.

Figure 2E:
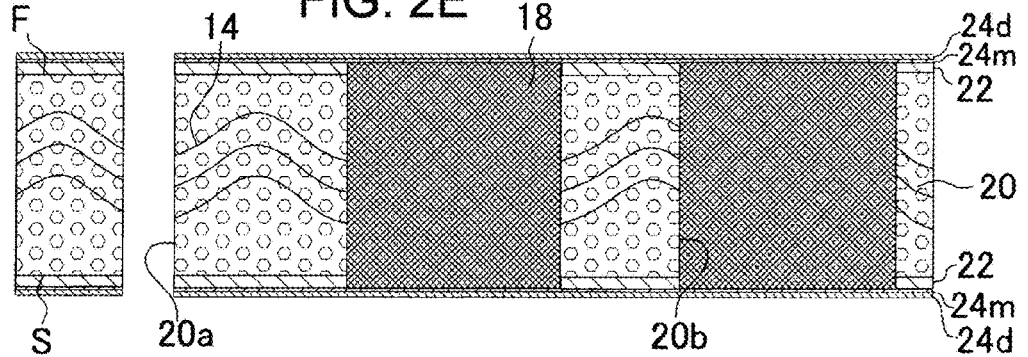

The second through holes (20a) are formed in the insulating substrate 20 (FIG. 2E). After that, the sidewalls (20S) of the second through holes (20a) are washed with a chemical solution. An example of the chemical solution is a potassium permanganate aqueous solution. In this case, the magnetic material 18 is covered by the chemical plating film (24m) and the electrolytic plating film (24d). The magnetic material 18 is not affected by the chemical solution. Oxidation of the magnetic particles can be suppressed.

Figure 3A:
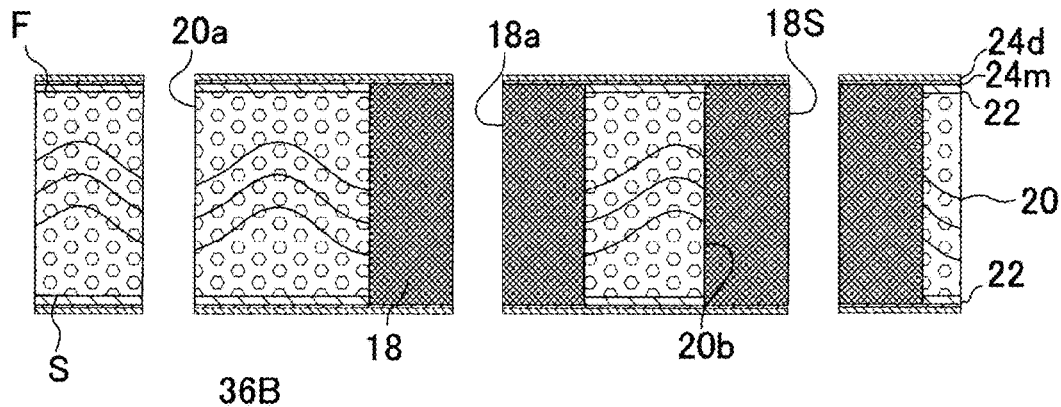
FIGS. 3A-3D are process diagrams illustrating the method for manufacturing a printed wiring board according to the embodiment.

The first through holes (18a) are formed respectively in the magnetic material 18. The sidewalls (18S) of the first through holes (18a) are washed by high-pressure water washing (FIG. 3A). In the embodiment, the time between the formation of the first through holes (18a) and the washing of the first through holes (18a) is managed. An oxygen content of the water used in the washing of the first through holes (18a) is managed. An oxidation agent is not used in the washing of the first through holes (18a). Oxidation of the magnetic particles 117 can be suppressed.

The first chemical plating film 321 is formed on the sidewalls (18S) of the first through holes (18a). In the embodiment, the time between the washing of the first through holes (18a) and the formation of the first chemical plating film 321 is managed. Or, when the sidewalls (18S) of the first through holes (18a) are exposed, the insulating substrate 20 is stored in an inert atmosphere. Oxidation of the magnetic particles 117 can be suppressed. Therefore, when the first chemical plating film 321 is formed, the substitution plating film (32a) is formed on the surfaces of the first particles (117A). The first chemical plating film 321 is also formed on the electrolytic plating film (24d).

The second chemical plating film 322 is formed on the sidewalls (20S) of the second through holes (20a). The second chemical plating film 322 is also formed on the electrolytic plating film (24d). The first chemical plating film 321 and the second chemical plating film 322 are formed at the same time. In this case, the first chemical plating film 321 and the second chemical plating film 322 are the same. The first chemical plating film 321 is formed on the sidewalls (20S) of the second through holes (20a). The second chemical plating film 322 does not exist on the electrolytic plating film (24d).

The first electrolytic plating film 341 is formed on the first chemical plating film 321. The first through-hole conductors (36A) are formed by the first chemical plating film 321 and the first electrolytic plating film 341 on the first chemical plating film 321.

Figure 3B:
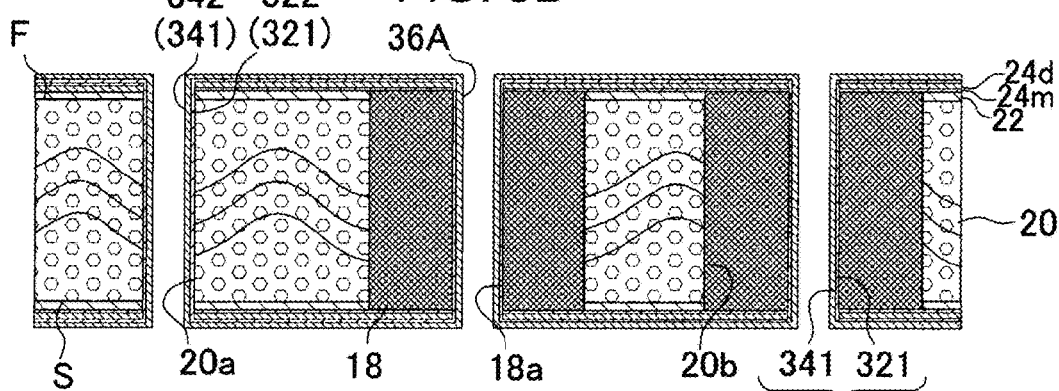

The second electrolytic plating film 342 is formed on the second chemical plating film 322. The second through-hole conductors (36B) are formed by the second chemical plating film 322 and the second electrolytic plating film 342 on the second chemical plating film 322. The first electrolytic plating film 341 and the second electrolytic plating film 342 are formed at the same time. In this case, the first electrolytic plating film 341 and the second electrolytic plating film 342 are the same. The first electrolytic plating film 341 is formed on the sidewalls (20S) of the second through holes (20a). The second electrolytic plating film 342 does not exist on the electrolytic plating film (24d). The first through-hole conductors (36A) and the second through-hole conductors (36B) are formed at the same time (FIG. 3B).

Figure 3C:
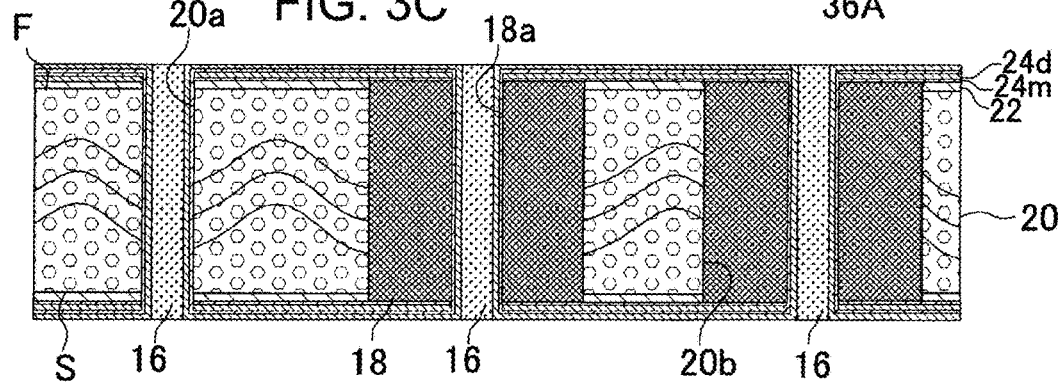
Figure 3D:
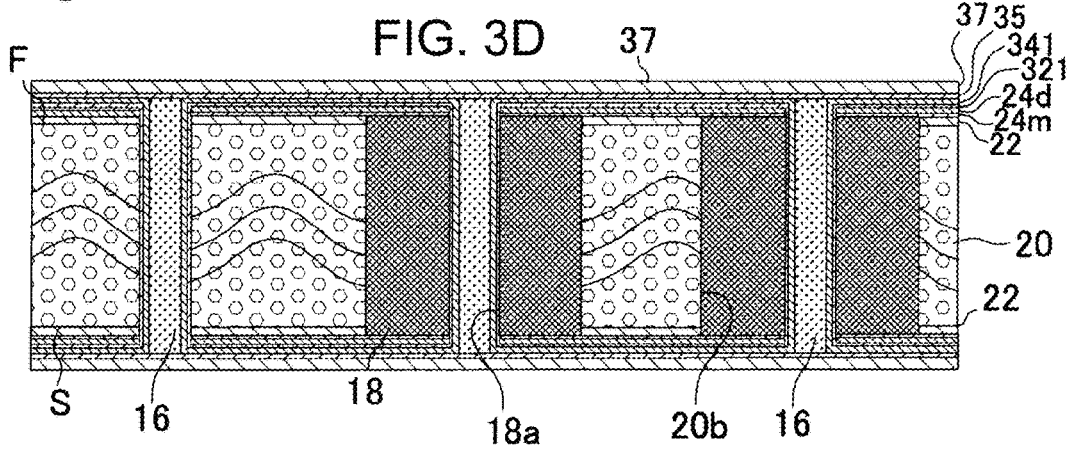

The resin 16 is filled in the first through-hole conductors (36A) and the second through-hole conductors (36B) (FIG. 3C). A third chemical plating film 35 is formed on the first electrolytic plating film 341 and the resin 16. A third electrolytic plating film 37 is formed on the third chemical plating film 35 (FIG. 3D). An etching resist is formed on the third electrolytic plating film 37.

The third electrolytic plating film 37, the third chemical plating film 35, the first electrolytic plating film 341, the first chemical plating film 321, the electrolytic plating film (24d), the chemical plating film (24m), and the copper foil 22 that are exposed from the etching resist are removed. The etching resist is removed. The first conductor layer (58F) and the second conductor layer (58S) are formed. The core substrate 30 is completed. The first conductor layer (58F) and the second conductor layer (58S) formed on the magnetic material 18 do not include the copper foil 22. The first conductor layer (58F) and the second conductor layer (58S) on the magnetic material 18 are formed by the chemical plating film (24m), the electrolytic plating film (24d), the first chemical plating film 321, the first electrolytic plating film 341, the third chemical plating film 35, and the third electrolytic plating film 37. The first conductor layer (58F) and the second conductor layer (58S) on the magnetic material 18 are formed by the chemical plating films and the electrolytic plating films.

The first conductor layer (58F) and the second conductor layer (58S) formed on the insulating substrate 20 include the copper foil 22. The first conductor layer (58F) and the second conductor layer (58S) on the insulating substrate 20 are formed by the copper foil 22, the chemical plating film (24m), the electrolytic plating film (24d), the first chemical plating film 321, the first electrolytic plating film 341, the third chemical plating film 35, and the third electrolytic plating film 37. The first conductor layer (58F) and the second conductor layer (58S) on the insulating substrate 20 are formed by the copper foil 22, the chemical plating films and the electrolytic plating films.

The upper side build-up layer (450F), the lower side build-up layer (450S), and the solder resist layers (470F, 470S) may be formed on the core substrate 30 using known manufacturing methods (FIG. 1A). The printed wiring board 10 can have the solder bumps (476F, 476S).

In a manufacturing method (first manufacturing method) of an inductor component of a first embodiment of Japanese Patent Application Laid-Open Publication No. 2019-129278, magnetic base material formed of iron filler and an epoxy resin is prepared. A through hole is formed in the magnetic base material. Then, inside of the through hole is washed with water. After that, a through-hole conductor is formed on an inner wall of the through hole. No details are disclosed in Japanese Patent Application Laid-Open Publication No. 2019-129278 regarding a method for washing the through hole and management between processes. For example, in the first manufacturing method, it is thought that an oxygen content of the water used for washing the through hole is not managed. Or, it is thought that the time from the formation of the through hole to the formation of the through-hole conductor is not controlled. Or, it is thought that an atmosphere from the formation of the through hole to the formation of the through-hole conductor is not controlled. An example of the atmosphere is temperature or humidity. Therefore, in Japanese Patent Application Laid-Open Publication No. 2019-129278, it is speculated that a thick oxide film is formed on surfaces of particles of the iron filler in the magnetic base material. Therefore, according to Japanese Patent Application Laid-Open Publication No. 2019-129278, it is thought that the through-hole conductor is formed on the oxide film formed on the surfaces of particles of the iron filler. In this case, it is predicted that the through-hole conductor will peel off from the magnetic base material.

A printed wiring board according to an embodiment of the present invention includes: an insulating substrate that has a first surface and a second surface on an opposite side with respect to the first surface, and has openings each extending from the first surface to the second surface; magnetic material that is formed in the openings and have first through holes each extending from the first surface to the second surface; a first conductor layer formed on the first surface; a second conductor layer formed on the second surface; and first through-hole conductors that are formed on sidewalls of the first through holes and connect the first conductor layer and the second conductor layer to each other. The magnetic material contains particles formed of a magnetic metal and a resin, the particles include particles (first particles) that form the sidewalls, and a substitution plating film is formed on surfaces of the first particles.

In the printed wiring board of the embodiment, the substitution plating film is formed on the surfaces of the first particles forming the sidewalls. Therefore, in the embodiment, the substitution plating film exists between the magnetic material and the first through-hole conductors. The substitution plating film contributes to the adhesion strength between the first through-hole conductors and the magnetic material. The first through-hole conductors are not formed on a magnetic metal covered by a thick oxide film. Therefore, in the embodiment, the adhesion between the first through-hole conductors and the magnetic material is maintained over a long time. Connection reliability via the first through-hole conductors formed on the magnetic material can be increased. When the substitution plating film is formed between the particles formed of a magnetic metal and the resin forming the magnetic material, the contribution of the substitution plating film can be increased. The substitution plating film preferably enters into between the particles formed of a magnetic metal and the resin forming the magnetic material.

In the embodiment, the magnetic material is in direct contact with the insulating substrate. Therefore, it is thought that stress caused by a difference in thermal expansion coefficient between the two directly acts on the magnetic material. Due to the stress, the adhesion strength between the first through-hole conductors and the magnetic material is expected to decrease. Or, the first through-hole conductors are expected to be disconnected. However, in the embodiment, the substitution plating film contributes to the adhesion strength between the first through-hole conductors and the magnetic material. Therefore, such a problem is unlikely to occur.

The printed wiring board of the embodiment has the multiple openings. The magnetic material is formed in the openings. Each of the magnetic material has one first through hole. Therefore, a volume of each of the magnetic material can be reduced. Therefore, stress acting between the magnetic material and the first through-hole conductors can be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an insulating substrate;
a first conductor layer formed on a first surface of the insulating substrate;
a second conductor layer formed on a second surface of the insulating substrate on an opposite side with respect to the first surface; and
a plurality of through-hole conductors formed through the insulating substrate and connecting the first conductor layer and the second conductor layer,
wherein the insulating substrate has a plurality of openings formed such that each of the openings extends from the first surface to the second surface of the insulating substrate, and magnetic material filling the openings and forming a plurality of through holes such that each of the through holes extends from the first surface to the second surface of the insulating substrate, the plurality of through-hole conductors is formed on sidewalls of the through holes formed in the magnetic material, respectively, the magnetic material includes resin material and a plurality of particles comprising a magnetic metal such that the plurality of particles includes a group of particles forming the sidewalls of the through holes and that each of the particles in the group has a substitution plating film formed on a surface thereof, and the plurality of particles is formed such that the particles in the group have exposed surfaces forming the sidewall of the through holes and inner surfaces and that each of the inner surfaces has the substitution plating film.

2. The printed wiring board according to claim 1, wherein the plurality of particles is selected from the group consisting of a plurality of iron particles, a plurality of nickel particles, and a plurality of cobalt particles.

3. The printed wiring board according to claim 2, wherein the plurality of through-hole conductors comprises a plurality of copper plating films, respectively, and the plurality of particles is formed such that the substitution plating film comprises copper.

4. The printed wiring board according to claim 1, wherein the plurality of through-hole conductors comprises a plurality of copper plating films, respectively.

5. The printed wiring board according to claim 4, wherein the plurality of particles is formed such that the substitution plating film comprises copper.

6. The printed wiring board according to claim 1, wherein the plurality of particles is formed such that each of the exposed surfaces has the substitution plating film.

7. The printed wiring board according to claim 1, further comprising:
a plurality of second through-hole conductors formed through the insulating substrate,
wherein the insulating substrate has a plurality of second through holes penetrating through the insulating substrate such that the plurality of second through-hole conductors is formed on sidewalls of the second through holes, respectively.

8. The printed wiring board according to claim 7, wherein the plurality of second through-hole conductors is formed such that the plurality of second through-hole conductors is formed directly on the sidewalls of the second through holes, respectively.

9. The printed wiring board according to claim 1, wherein the plurality of through-hole conductors is formed such that each of the through-hole conductors comprises a chemical plating film and an electrolytic plating film on the chemical plating film.

10. The printed wiring board according to claim 9, wherein the plurality of through-hole conductors is formed such that the chemical plating film is formed directly on the plurality of particles.

11. The printed wiring board according to claim 9, wherein the substitution plating film is formed by a substitution reaction between a metal forming the particles in the group and a metal forming the chemical plating film.

12. The printed wiring board according to claim 1, wherein the plurality of particles includes a second group of particles formed such that the second particles are completely embedded in the magnetic material filling the openings of the insulating substrate.

13. The printed wiring board according to claim 12, wherein the plurality of particles is formed such that the substitution plating film is not formed on the second group of particles.

14. The printed wiring board according to claim 1, wherein the insulating substrate is formed such that the magnetic material is in contact with sidewalls of the insulating substrate exposed by the openings.

15. The printed wiring board according to claim 1, wherein the insulating substrate is formed such that each of the openings has one of the through holes formed therein.

16. A printed wiring board, comprising:
an insulating substrate;
a first conductor layer formed on a first surface of the insulating substrate;
a second conductor layer formed on a second surface of the insulating substrate on an opposite side with respect to the first surface; and
a plurality of through-hole conductors formed through the insulating substrate and connecting the first conductor layer and the second conductor layer,
wherein the insulating substrate has a plurality of openings formed such that each of the openings extends from the first surface to the second surface of the insulating substrate, and magnetic material filling the openings and forming a plurality of through holes such that each of the through holes extends from the first surface to the second surface of the insulating substrate, the plurality of through-hole conductors is formed on sidewalls of the through holes formed in the magnetic material, respectively, the magnetic material includes resin material and a plurality of particles comprising a magnetic metal such that the plurality of particles includes a group of particles forming the sidewalls of the through holes and that each of the particles in the group has a substitution plating film formed on a surface thereof, and the plurality of particles includes a second group of particles formed such that the second particles are completely embedded in the magnetic material filling the openings of the insulating substrate and is formed such that the substitution plating film is not formed on the second group of particles.

17. The printed wiring board according to claim 16, wherein the plurality of particles is selected from the group consisting of a plurality of iron particles, a plurality of nickel particles, and a plurality of cobalt particles.

18. The printed wiring board according to claim 16, wherein the plurality of through-hole conductors comprises a plurality of copper plating films, respectively.

19. The printed wiring board according to claim 18, wherein the plurality of particles is formed such that the substitution plating film comprises copper.

20. The printed wiring board according to claim 16, further comprising:
   a plurality of second through-hole conductors formed through the insulating substrate,
   wherein the insulating substrate has a plurality of second through holes penetrating through the insulating substrate such that the plurality of second through-hole conductors is formed on sidewalls of the second through holes, respectively.

* * * * *